(12) United States Patent
Ando et al.

(10) Patent No.: US 10,886,334 B2
(45) Date of Patent: *Jan. 5, 2021

(54) VERTICAL ARRAY OF RESISTIVE SWITCHING DEVICES HAVING A TUNABLE OXYGEN VACANCY CONCENTRATION

(71) Applicant: International Business Machines Corporation, Armonk, NY (US)

(72) Inventors: Takashi Ando, Eastchester, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,194

(22) Filed: Nov. 15, 2019

(65) Prior Publication Data

US 2020/0091231 A1 Mar. 19, 2020

Related U.S. Application Data

(62) Division of application No. 16/015,934, filed on Jun. 22, 2018, now Pat. No. 10,700,129.

(51) Int. Cl.
*H01L 27/24* (2006.01)
*H01L 45/00* (2006.01)

(52) U.S. Cl.
CPC .......... *H01L 27/249* (2013.01); *H01L 45/08* (2013.01); *H01L 45/1226* (2013.01);
(Continued)

(58) Field of Classification Search
CPC ............ H01L 27/2409; H01L 27/2427; H01L 27/2463; H01L 27/249; H01L 45/08;
(Continued)

(56) References Cited

U.S. PATENT DOCUMENTS 7,115,927 B2  10/2006  Hideki et al.
8,343,813 B2   1/2013  Kuse et al.
(Continued)

OTHER PUBLICATIONS

Ando et al., "Vertical Array of Resistive Switching Devices Having a Tunable Oxygen Vacancy Concentration," U.S. Appl No. 16/015,934, filed Jan. 11, 2018.
(Continued)

*Primary Examiner* — Stephen W Smoot
(74) *Attorney, Agent, or Firm* — Cantor Colburn LLP; Randall Bluestone

(57) ABSTRACT

Embodiments of the invention are directed to a vertical resistive device. A non-limiting example of the vertical resistive device includes a conductive horizontal electrode, an opening extending through the horizontal electrode, a filament region positioned within the opening and communicatively coupled to a sidewall of the horizontal electrode, and a conductive vertical electrode positioned within the opening and communicatively coupled to the filament region. The vertical electrode includes a first conductive alloy material. Oxygen vacancy formation in the filament region is controlled by the first conductive alloy material of the vertical electrode. A room temperature resistivity of the first conductive alloy material is below about $5\times10^{-8}$ ohm meters and controlled by at least one of the metals that form the first conductive alloy material.

19 Claims, 8 Drawing Sheets

(52) U.S. Cl.
CPC ...... *H01L 45/1246* (2013.01); *H01L 45/1253* (2013.01); *H01L 45/1266* (2013.01); *H01L 45/146* (2013.01); *H01L 45/1608* (2013.01); *H01L 45/1683* (2013.01)

(58) Field of Classification Search
CPC ............. H01L 45/1226; H01L 45/1233; H01L 45/1246; H01L 45/1253; H01L 45/1266; H01L 45/146; H01L 45/1608; H01L 45/1683
See application file for complete search history.

(56) References Cited

U.S. PATENT DOCUMENTS

| | | | |
|---|---|---|---|
| 8,390,100 | B2 | 3/2013 | Bornstein |
| 8,558,348 | B2 | 10/2013 | Oh et al. |
| 8,785,899 | B2 | 7/2014 | Ju et al. |
| 8,995,166 | B2 | 3/2015 | Pramanik et al. |
| 9,305,977 | B1 | 4/2016 | Hsu |
| 9,343,672 | B2 | 5/2016 | Park et al. |
| 9,391,271 | B1 | 7/2016 | Hsu et al. |
| 2013/0105876 | A1 | 5/2013 | Hwang |
| 2013/0277636 | A1 | 10/2013 | Lee et al. |
| 2014/0268995 | A1 | 9/2014 | Joo et al. |
| 2015/0340406 | A1 | 11/2015 | Jo |
| 2018/0342557 | A1 | 11/2018 | Mori |
| 2019/0378876 | A1* | 12/2019 | Ando .................. H01L 45/1266 |

OTHER PUBLICATIONS

Baek et al., "Realization of Vertical Resistive Memory (VRRAM) using cost effective 3D Process," 2011 IEEE International Electron Devices Meeting (IEDM), IEEE, 2011, 31.8, 4 pages.

Electronic Materials Research Laboratory, "Redox-based Tera-bit memories," http://www.emrl.de/r_a_1.html (retrieved Jan. 3, 2018), 10 pages.

Hinkle et al., "Dipole Controlled Metal Gate with Hybrid Low Resistivity Cladding for Gate-Last CMOS with Low Vt," 2010 Symposium on VLSI Technology (VLSIT), IEEE, 2010, pp. 183-184.

Kwon et al., "A Novel Low Resistance Gate Fill for Extreme Gate Length Scaling at 20nm and Beyond for Gate-Last High-k/Metal Gate CMOS Technology," 2012 Symposium on VLSI Technology (VLSIT), IEEE, 2012, pp. 29-30.

List of IBM Patents or Patent Applications Treated as Related; Date Filed: Nov. 15, 2019, 2 pages.

Wong et al., "Metal—Oxide RRAM," Proceedings of the IEEE, vol. 100, No. 6, Jun. 2012, pp. 1951-1970.

* cited by examiner

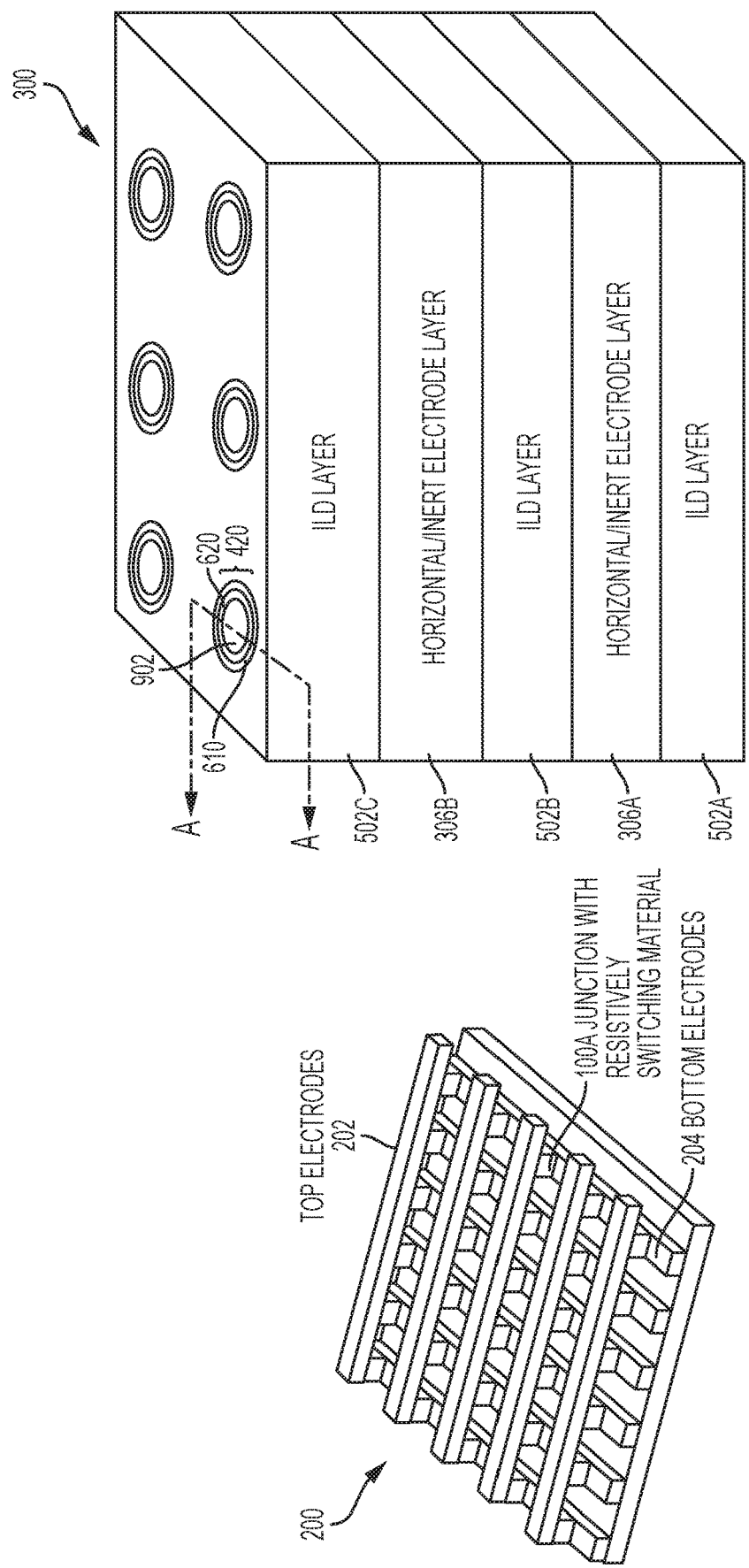

| RESISTIVITY (OHM METERS) | RESISTIVITY TYPE | EXAMPLE MATERIALS |
| --- | --- | --- |
| $\rho < 10^6$ | LOW RESISTIVITY | METALS AND ALLOYS |
| $\rho = 10^6$ TO $10^9$ | MEDIUM RESISTIVITY | SOME ORGANIC POWDERS, CONCRETE, WOOD |
| $\rho > 10^9$ | HIGH RESISTIVITY | SYNTHETIC POLYMERS |

VERTICAL ARRAY OF RESISTIVE SWITCHING DEVICES HAVING A TUNABLE OXYGEN VACANCY CONCENTRATION

DOMESTIC PRIORITY

This application is a divisional of U.S. application Ser. No. 16/015,934, filed Jun. 22, 2018, the contents of which are incorporated by reference herein in its entirety.

BACKGROUND

The present invention relates in general to resistive switching devices (RSDs). More specifically, the present invention relates to fabrication methods and resulting structures for forming a three-dimensional vertical array of RSDs configured and arranged to provide a tunable oxygen vacancy concentration.

Resistive random access memory (ReRAM) is a nanoscale non-volatile memory (NVM). ReRAM provides simple storage cell components, high density, low power, large endurance, fast write/read/erase speeds, and excellent scalability. A typical ReRAM storage cell is two-terminal device formed as a metal-insulator-metal (MIM) structure. The insulator material can be a binary metal oxide, which makes the MIM storage cell compatible with silicon-based CMOS (complementary metal oxide semiconductor) fabrication process. When a sufficient electrical field or signal is applied across the metal electrodes of a MIM, the resistance of the insulator can be switched from one resistance state to another through various mechanisms, including the formation and rupture of conductive filaments in the metal oxide. The oxygen vacancy concentration ($V_O$) in the oxide of the binary metal oxide and the state of the insulator/electrode interface are significant factors in controlling the resistive switching mechanism in a MIM memory cell. The insulator retains its resistance state until an appropriate electrical signal is applied across the MIM metal electrodes to change it.

SUMMARY

Embodiments of the invention are directed to a vertical resistive device. A non-limiting example of the vertical resistive device includes a conductive horizontal electrode, an opening extending through the horizontal electrode, a filament region positioned within the opening and communicatively coupled to a sidewall of the horizontal electrode, and a conductive vertical electrode positioned within the opening and communicatively coupled to the filament region. The vertical electrode includes a first conductive alloy material. Oxygen vacancy formation in the filament region is controlled by the first conductive alloy material of the vertical electrode. A room temperature resistance of the filament region is below about $1 \times 10^6$ ohm and controlled by at least one of the metals that form the first conductive alloy material.

Embodiments of the invention are directed to a method of fabricating a vertical resistive device. A non-limiting example of the method includes forming a conductive horizontal electrode, forming an opening that extends through the horizontal electrode, depositing a filament region within the opening such that the filament region is communicatively coupled to a sidewall of the horizontal electrode, depositing a barrier region within the opening such that the barrier region is communicatively coupled to the filament region, and forming a conductive vertical electrode within a remaining portion of the opening such that the vertical electrode is communicatively coupled to the barrier region. The vertical electrode includes a first conductive alloy material. Oxygen vacancy formation in the filament region is controlled by the first conductive alloy material of the vertical electrode. A room temperature resistance of the filament region is below about $1 \times 10^6$ ohm and controlled by at least one of the metals that form the first conductive alloy material.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 2 depicts a simplified block diagram illustrating how the RSD component shown in FIG. 1A can be utilized as an addressable cross-point storage cell of an ReRAM crossbar array capable of incorporating aspects of the invention;

FIG. 3 depicts a simplified block diagram illustrating a vertical ReRAM array capable of incorporating aspects of the invention;

FIGS. 5-9 illustrate cross-sectional views depicting the results of fabrication operations in accordance with embodiments of the invention for forming the RSDs of the vertical ReRAM array shown in FIG. 4, in which:

FIG. 5 depicts a cross-sectional view of the vertical ReRAM array after fabrication operations according to aspects of the invention;

FIG. 6 depicts a cross-sectional view of the vertical ReRAM array after fabrication operations according to aspects of the invention;

FIG. 7 depicts a cross-sectional view of the vertical ReRAM array after fabrication operations according to aspects of the invention;

FIG. 8 depicts a cross-sectional view of the vertical ReRAM array after fabrication operations according to aspects of the invention; and FIG. 9 depicts a cross-sectional view of the vertical ReRAM array after fabrication operations according to aspects of the invention;

FIG. 11 depicts a table showing example ranges and material types for low resistivity, medium resistivity, and high resistivity according to aspects of the present invention.

DETAILED DESCRIPTION

Figure 1B:
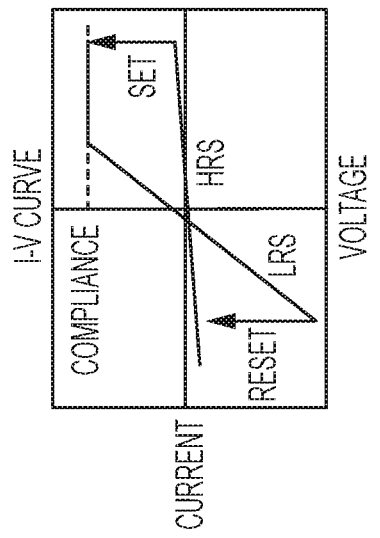
FIG. 1B depicts a diagram of an I-V curve illustrating the switching operation of the RSD component shown in FIG. 1A.

It is understood in advance that, although this detailed description provides fabrication methods and resulting structures for a specific type of RSD in a three-dimensional (3D) vertical ReRAM array, implementation of the teachings recited herein are not limited to a particular type of RSD or array architecture. Rather, embodiments of the present invention are capable of being implemented in conjunction with any other type of RSD (e.g., phase change memory, spin-transfer torque memory, and the like) or array architecture (e.g., RAM, neuromorphic computing applications, etc.), now known or later developed.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. ReRAM is a high speed, high density, and low fabrication-cost NVM technology. Thus, ReRAM has the potential to replace and/or complement the limited scaling of flash memories and other silicon-based memories such as dynamic random access memory (DRAM) and static random access memory (SRAM).

A typical ReRAM storage cell is a two-terminal device formed as a metal-insulator-metal (MIM) structure, which is a simpler construction than the three terminal storage cells used in conventional CMOS-based DRAM or flash memory. The insulator material in the MIM device can be a binary metal oxide, which makes fabricating a MIM ReRAM storage cell compatible with silicon-based CMOS fabrication process. The resistance of a ReRAM storage cell serves as the switchable conduction state that stores data. When a sufficient electrical field/signal is applied across the metal electrodes of a MIM, the resistance of the insulator can be switched from one resistance state to another through various mechanisms, including the formation and rupture of one-dimensional conductive filaments formed in the metal oxide during electroforming. The formation and rupture of the conducting filaments involves various reduction-oxidation (redox) reactions and depends on the metal/electrode material. The oxygen vacancy concentration ($V_O$) in the oxide of the binary metal oxide and the state of the insulator/electrode interface are significant factors in controlling the resistive switching mechanism in a MIM memory cell. Thus, it is desirable to use insulators in the form of oxides with a high mobility of oxygen vacancies (e.g., single-layer non-stoichiometric or double-layer oxide structures with ionic bonding).

Because each MIM ReRAM storage cell uses only two external terminals, these memories can be accommodated in an array (e.g., the crossbar array 200 shown in FIG. 2; and the vertical ReRAM array 300 shown in FIG. 3), which is compatible with a variety of electronic circuits and devices, including ultra-high density NVM and artificial neural network (ANN) architectures. A basic array includes a set of conductive row electrodes and a set of conductive column electrodes formed to intersect the set of conductive row electrodes. The intersections between the two sets of electrode lines are separated by a so-called "cross-point" device, which, in ReRAM memory circuits, can be implemented as a two-terminal MIM RSD. The conduction state (e.g., resistance) of the MIM insulator can be altered by controlling the voltages applied between individual electrode lines of the row and column electrode lines. Digital data can be stored by alteration of the insulator material's conduction state at the intersection to achieve a high conduction state (or low resistance state (LRS)) or a low conduction state (or high resistance state (HRS)). The MIM insulator material can also be programmed to maintain two or more distinct conduction states by selectively setting the conduction state of the material. The conduction state of the memristor material can be read by applying a voltage across the material and measuring the current that passes through the target crosspoint device.

In neuromorphic computing applications (e.g., ANN), an RSD can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of ReRAMs, which naturally expresses a fully-connected neural network.

The density of MIM ReRAMs in an array can be increased by forming the array as a 3D stack of ReRAM cells as practiced, for example, in Flash NAND technology. A vertical ReRAM array (e.g., the vertical ReRAM array 300 shown in FIG. 3) is an example of a 3D array. In a vertical ReRAM array, a stack of horizontal plates serves as shared bottom electrodes, and vertical electrodes (e.g., a conductive pillar) extend through openings/vias in the stack of horizontal plates to serve as shared top electrodes. A metal oxide is wrapped around each of the vertical electrodes such that both the metal oxide and one of the vertical electrodes occupy each opening/via in the stacked horizontal plates. An individual ReRAM cell/stack of the vertical ReRAM array is defined at each intersection between a horizontal plate (bottom electrode) and a vertical electrode (top electrode). The metal oxide of each individual ReRAM cell/stack is the portion of the metal oxide that is around the vertical electrode at the horizontal/vertical electrode intersection.

In general, the vertical electrode and metal oxide of a MIM cell/stack (e.g., MIM stack 100 shown in FIG. 1A) can be deposited by physical vapor deposition (PVD) in order to control the oxygen vacancy concentration in the metal oxide layer. However, it is difficult to apply PVD fabrication techniques to ReRAM cells/stacks in 3D array structures. Atomic layer deposition (ALD) has been proposed as a method to deposit the metal oxide around and the vertical electrode of a 3D ReRAM cell/stack. However, as the opening/via diameter of the 3D array is continuously reduced due to scaling, the resistivity of the vertical electrodes become high due to limited area for metal deposition. Additionally, because stoichiometric compositions are expected from oxides deposited by ALD combined with metals deposited by CVD, it can be difficult to control the oxygen vacancy ($V_O$) concentration in the metal oxide.

Turning now to an overview of aspects of the present invention, embodiments of the invention address the shortcomings of the prior art by providing fabrication methodologies and resulting structures for forming a 3D vertical array of RSDs configured and arranged to provide a tunable oxygen vacancy concentration in the RSD metal oxide. In embodiments of the invention, the RSD includes a vertical electrode configured in a manner that provides both low resistivity and tunable control over the oxygen vacancy concentration in the RSD metal oxide.

In embodiments of the invention, multiple RSDs are fabricated in a 3D vertical array by forming a stack that includes alternating layers of dielectric material and horizontal layers of inert metal (e.g., TiN, TaN, W). Multiple openings/vias are formed through the stack, and a layer of metal oxide film (HfOx, TaOx, TiOx) is conformally deposited (e.g., by ALD) in each opening. Barrier metal layers are deposited on each of the metal oxide layers. In embodiments of the invention, the barrier metal can be titanium nitride (TiN), tantalum nitride (TaN), hafnium nitride (HfN), niobium nitride (NbN), tungsten nitride (WN), or combinations thereof. The remaining portions of the openings/vias are each filled with a wetting layer (e.g., Ti, Co) and a fill metal. In embodiments of the invention, the fill metal is an oxygen gathering or "gettering" material having low resistivity (e.g., below about $5 \times 10^{-8}$ ohm meters). In general, a "gettering" or "getter" material is a reactive material that exhibits the property of "getting" or scavenging another material. For example, an oxygen getter material exhibits the property of combining with nearby oxygen molecules chemically or by absorption, which removes oxygen from either the environment or from another material to which the oxygen getter material is communicatively coupled. Al is an example of an oxygen gettering material because Al is very effective at gettering (i.e., reacting with and removing) oxygen that is present in either the environment or another material to which the Al is communicatively coupled. In contrast, tungsten (W) is an example of a material that is not an oxygen gettering material because W is not effective at "getting" or scavenging oxygen from another material. Accordingly, in embodiments of the invention, the fill metal can be a material such as Al, which has low resistivity and is an oxygen getter material.

In embodiments of the invention, a reflow process is applied to the wetting layer and the fill metal. The barrier metal and the fill metal are dissimilar metals. Accordingly, the wetting layer assists in binding the barrier metal to the resulting wetting layer and fill metal alloy during the reflow process. The barrier layer material is configured (or selected) to prevent diffusion and/or alloying of metal material between the metal oxide and the wetting layer and/or the fill metal during the reflow process. The barrier layer material is also configured (or selected) to allow oxygen molecules to diffuse through it to the post-reflow vertical alloy to allow the post-reflow alloy to assist in the creation of oxygen vacancies in the metal oxide layer. The wetting layer and the metal fill intermix during the reflow process to form an alloy (e.g., Ti—Al or Co—Al) that functions in the final RSD structure as the vertical electrode. In accordance with aspects of the invention, the reflowed alloy of the vertical electrode has low resistivity properties. In accordance with aspects of the invention, the reflowed alloy of the vertical electrode is also an oxygen getter material that contributes to the formation of oxygen vacancies in the metal oxide layer by pulling or gathering oxygen from the metal oxide and across the barrier metal. In embodiments of the invention, the diffusion of oxygen molecules across the barrier metal can be tuned by selecting the material/alloy that forms the barrier metal and by selecting the thickness of the barrier metal layer.

In an exemplary reflow process, the 3D vertical array is subjected to controlled heat, which melts at least the wetting layer and the fill metal, thereby mixing the wetting layer and the fill metal to form the alloy that functions as the vertical electrode. The wetting layer assists in attaching the resulting alloy to the barrier metal and provides a communicative coupling for the diffusion of oxygen molecules from the metal oxide layer through the barrier metal to the oxygen getting material of the vertical electrode alloy.

The heating for the reflow process can be accomplished by performing physical vapor deposition (PVD) at an elevated temperature (e.g. 400° C. for Al). The reflow process melts at least the wetting layer and the fill metal and heats the adjoining surfaces of the 3D vertical array without overheating and damaging the other components of the 3D vertical array. An exemplary reflow process includes four stages or zones, namely preheat, thermal soak, reflow and cooling, wherein each stage has a distinct thermal profile.

The $V_O$ concentration in the metal oxide, in accordance with aspects of the invention, is controlled by several parameters, including the thickness of the barrier metal, the thickness of the wetting layer, the type of material used to form the barrier metal, the type of material used to form the wetting layer, and the type of material used to form the fill metal. Accordingly, embodiments of the invention allow the $V_O$ concentration in the metal oxide to be tuned by selecting one or more of the thickness of the barrier metal, the thickness of the wetting layer, the type of material used to form the barrier metal, the type of material used to form the wetting layer, and the type of material used to form the fill metal. In embodiments of the invention, the fill metal is selected to be a material (e.g., Al) that provides both low resistivity (e.g., below about $5 \times 10^{-8}$ ohm meters) and oxygen gathering/gettering characteristics. In embodiments of the invention, the wetting layer is selected to be a material (e.g., Ti, Co) that provides both low resistivity and oxygen gathering/gettering characteristics. In embodiments of the invention, the barrier metal is selected to be a material configured to prevent diffusion and/or alloying of metal material between the metal oxide and the wetting layer and/or the fill metal during the reflow process, while also having sufficient oxygen diffusion characteristics to allow oxygen to pass from the metal oxide to the reflowed oxygen gathering alloy of the vertical electrode, thereby creating oxygen vacancies in the metal oxide.

Figure 1A:
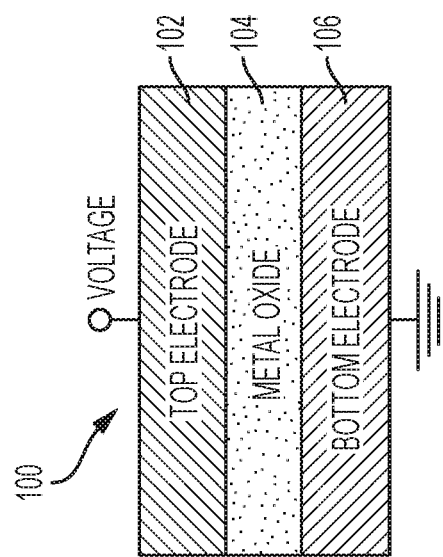
FIG. 1A depicts a simplified block diagram illustrating a cross-sectional view of a two-terminal resistive switching device (RSD), which can be used as a storage cell of an ReRAM structure capable of incorporating aspects of the invention.

Turning now to a more detailed description of example embodiments of the invention, FIG. 1A depicts a simplified block diagram illustrating a cross-sectional view of a two-terminal RSD component 100, which can be used as a storage cell of an ReRAM structure (e.g., crossbar array 200 shown in FIG. 2 or vertical ReRAM array 300 shown in FIG. 3) capable of incorporating aspects of the invention. The RSD storage cell 100 includes a top electrode 102, metal oxide active region 104, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is cancelled, which indicates the nonvolatile nature of ReRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of current conducting filament and the corresponding LRS resistance value.

FIG. 2 depicts a simplified block diagram illustrating how the RSD storage cell 100 shown in FIG. 1A can be utilized as an addressable cross-point storage cell 100A of an ReRAM crossbar array 200 capable of incorporating aspects of the invention. The array 200 includes perpendicular conductive top electrode lines 202 (e.g., wordline rows), conductive bottom electrode lines 204 (e.g., bitline columns), and RSD memory cells 100A at the intersection between each top electrode line 202 and bottom electrode line 204. The storage cell 100A can be configured to operate the same as the storage cell 100 shown in FIG. 1A. Each storage cell 100A can be accessed for read and write by biasing the corresponding top electrode line 202 and bottom electrode line 204.

FIG. 3 depicts a simplified block diagram illustrating how RSD storage cells 100B, 100C (shown in FIG. 4) can be utilized as an addressable memory of a 3D vertical ReRAM array 300 capable of incorporating aspects of the invention. The RSD storage cells 100B, 100C include novel features in accordance with aspects of the invention but function, at a high level, substantially the same as the RSD storage cell 100 shown in FIG. 1A. The 3D vertical array 300 includes a stack formed from alternating layers of interlayer dielectrics (ILDs) 502D, 502E, 502F and horizontal plates/electrodes 306C, 306D. For ease of illustration and explanation, only two horizontal plates/electrodes 306C, 306D and three ILD layers 502D, 502E, 502F are shown in FIG. 3. However, aspects of the invention can be applied to a stack having any number of ILD layers and horizontal plates/electrodes. Multiple openings/vias 602 (shown in FIG. 6) having width dimensions 420 extend through the stack. For ease of illustration and explanation, only six openings/vias 602 are shown in FIG. 3. However, aspects of the invention can be applied to a stack having any number of openings/vias 602. Within each opening/via 602 is a metal oxide layer 610, a barrier layer 620, and a vertical electrode 902 formed from a reflowed alloy, configured and arranged as shown.

Figure 4:
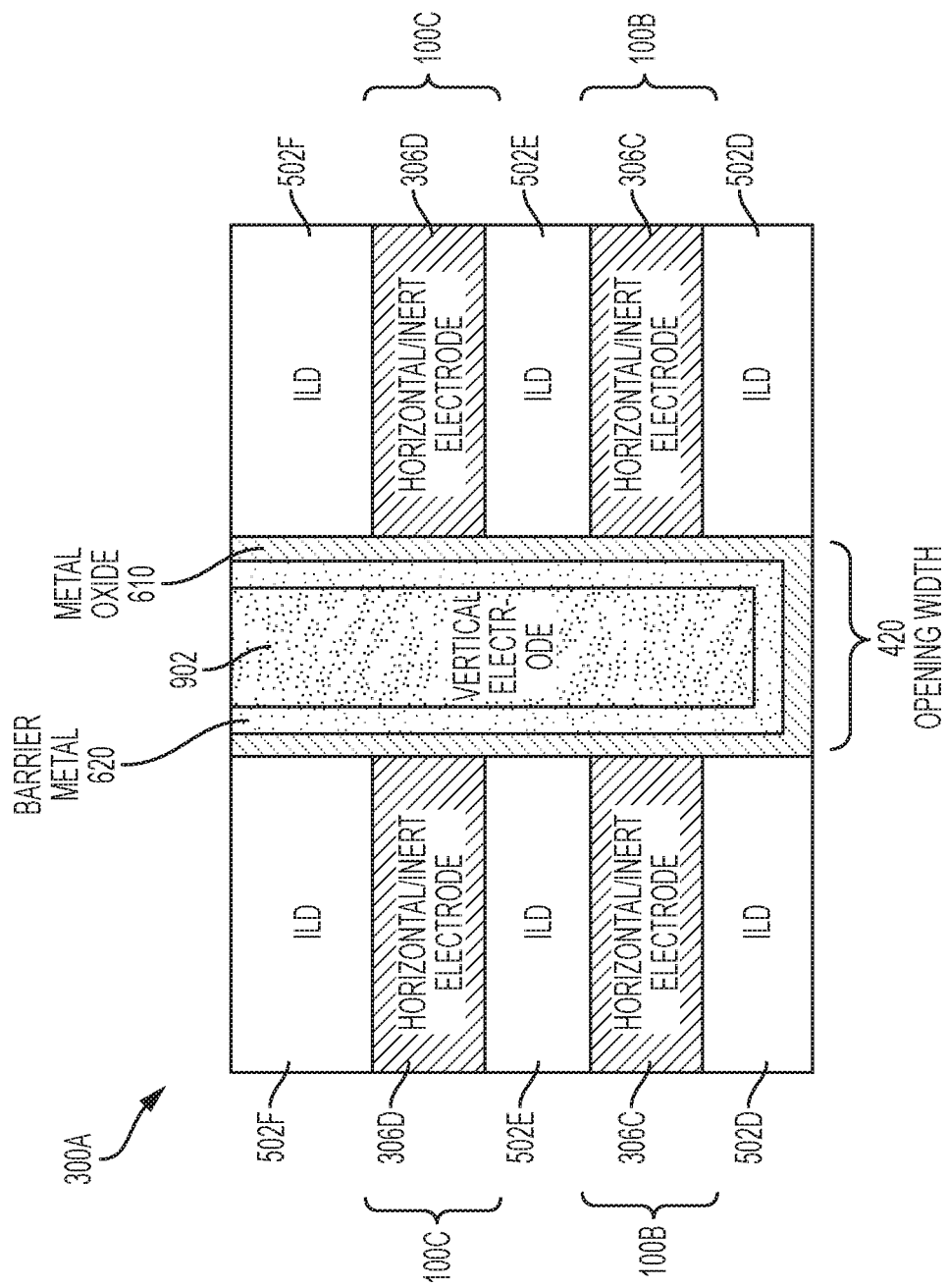
FIG. 4 depicts a cross-sectional view, taken along line A-A of FIG. 3, illustrating example RSDs of the vertical ReRAM array shown in FIG. 3.

FIG. 4 depicts a cross-sectional view, taken along line A-A in FIG. 3, of a portion 300A of the 3D vertical ReRAM array 300 (shown in FIG. 3). The 3D vertical ReRAM array 300A illustrates additional details of the RSD storage cells 100B, 100C. As shown in FIG. 4, the RSD storage cell 100B includes the horizontal/inert electrode 306C, a portion of the metal oxide layer 610, a portion of the barrier metal layer 620 and a portion of the alloyed vertical electrode 902, configured and arranged as shown. The horizontal/inert electrode 306C serves as the bottom electrode of the RSD storage cell 100B. The portion of the vertical electrode 902 that intersects with the horizontal/inert electrode 306C serves as the top electrode of the RSD storage cell 100B. The portion of the metal oxide layer 610 that is at the intersection between the horizontal/inert electrode 306C and the vertical electrode 902 serves at the metal oxide region of the RSD storage cell 100B. Similarly, the RSD storage cell 100C includes the horizontal/inert electrode 306D, a portion of the metal oxide layer 610, a portion of the barrier metal layer 620 and a portion of the alloyed vertical electrode 902, configured and arranged as shown. The horizontal/inert electrode 306D serves as the bottom electrode of the RSD storage cell 100C. The portion of the vertical electrode 902 that intersects with the horizontal/inert electrode 306D serves as the top electrode of the RSD storage cell 100C. The portion of the metal oxide layer 610 that is at the intersection between the horizontal/inert electrode 306D and the vertical electrode 902 serves at the metal oxide region of the RSD storage cell 100C.

Each RSD storage cells 100B, 100C A off the 3D vertical ReRAM array 300A can be accessed for read and write by biasing the corresponding vertical (or top) electrode 902 and horizontal/inert (or bottom) electrode 306C, 306D. Functionally, the RSD storage cells 100B, 100C operate substantially the same as the two-terminal MIM RSD component 100 (shown in FIG. 1). For example, using the RSD storage cell 100B as an example, when a sufficient electrical signal (e.g., a voltage) is applied across the top/bottom electrodes 902, 306C, the resistance of the metal oxide layer 610 at the intersection between the top/bottom electrodes 902, 306C can be switched from one resistance state to another. The metal oxide layer 610 retains its resistance state until an appropriate electrical signal is applied across the top/bottom electrodes 902, 306C to change it.

In accordance with aspects of the invention, the RSD storage cells 100B, 100C of the 3D vertical array 300A are configured and arranged to provide a tunable oxygen vacancy concentration in the metal oxide layer 610. In embodiments of the invention, the vertical electrode 902 of the RSD storage cells 100B, 100C is configured in a manner that provides both low resistivity and tunable control over the oxygen vacancy concentration in the metal oxide layer 610. The $V_O$ concentration in the metal oxide layer 610, in accordance with aspects of the invention, is controlled by several parameters, including the thickness of the barrier metal 620, the thickness of the wetting layer 710 (shown in FIG. 8), the type of material used to form the barrier metal layer 620, the type of material used to form the wetting layer 710, and the type of material used to form the fill metal 810

Figure 8:
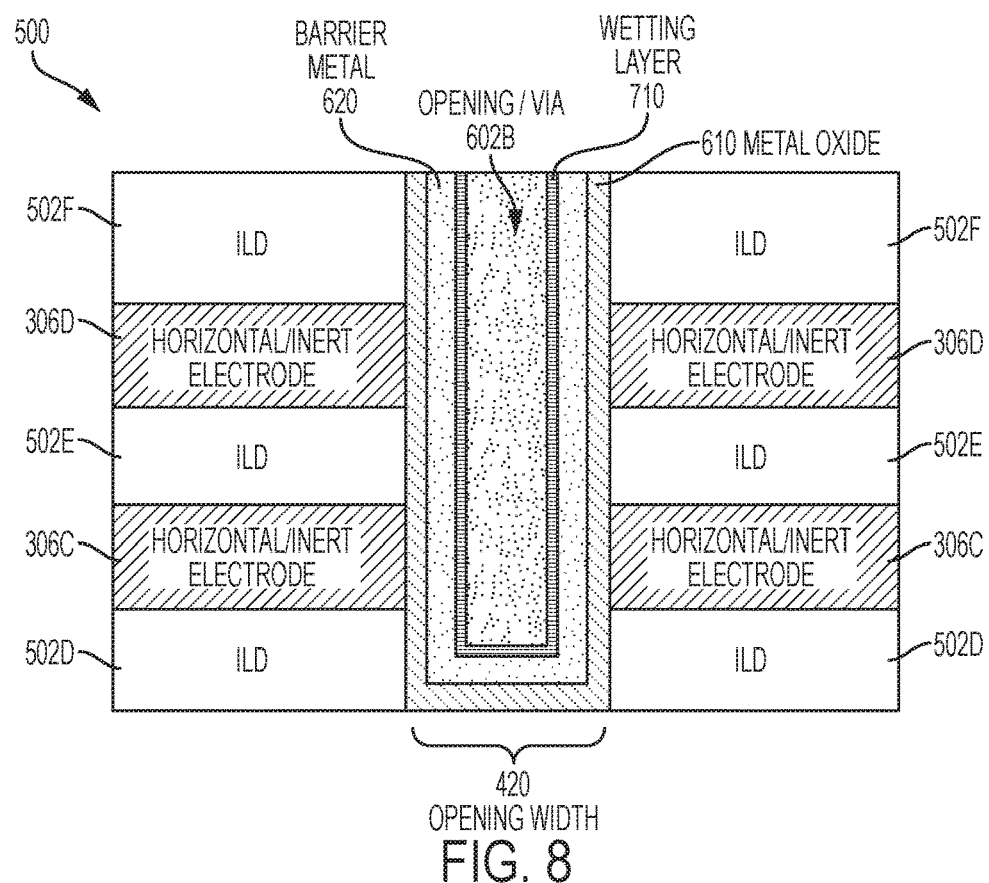
Figure 9:
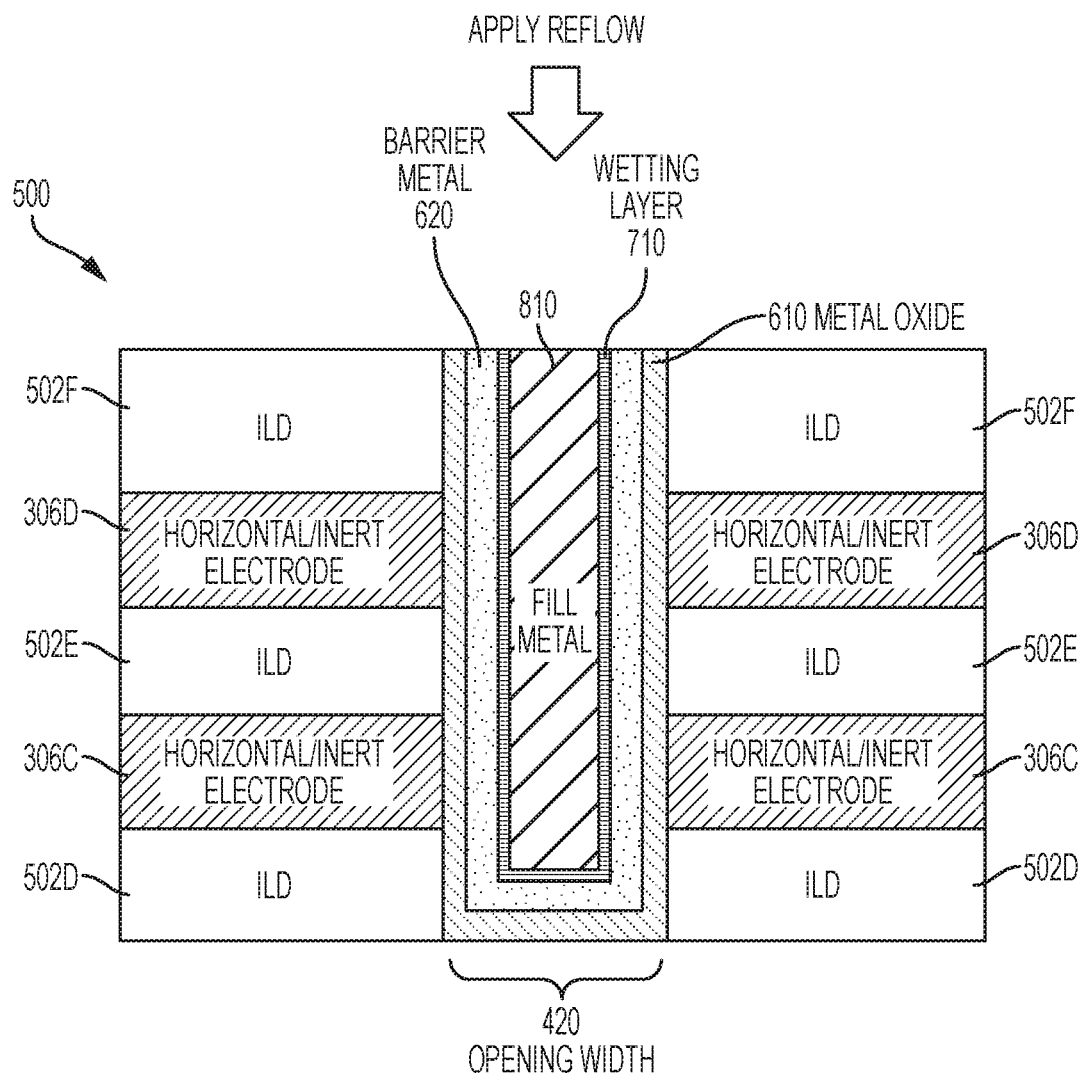

(shown in FIG. 9). As will be described in greater detail in connection with the fabrication operations shown in FIGS. 5-9, a reflow process is applied to mix the wetting layer 710 and the fill metal 810 to create an alloy that forms the vertical electrode 902.

The 3D vertical array 300A, in accordance with embodiments of the invention, allow the $V_O$ concentration in the metal oxide layer 610 to be tuned by selecting one or more of the thickness of the barrier metal layer 620, the thickness of the wetting layer 710, the type of material used to form the barrier metal layer 620, the type of material used to form the wetting layer 710, and the type of material used to form the fill metal 810. In embodiments of the invention, the fill metal 810 is selected to be a material (e.g., Al) that provides both low resistivity (e.g., below about $5 \times 10^{-8}$ ohm meters) and oxygen gathering/gettering characteristics. In embodiments of the invention, the wetting layer 710 is selected to be a material (e.g., Ti, Co) that facilitates reflow of the fill metal 810. In embodiments of the invention, the barrier metal 620 is selected to be a material configured to prevent diffusion and/or alloying of metal material between the metal oxide layer 610 and the wetting layer 710 (shown in FIG. 8) and/or the fill metal 810 (shown in FIG. 9) during the reflow process (shown in FIG. 9), while also having sufficient oxygen diffusion characteristics to allow oxygen to pass from the metal oxide layer 620 to the reflowed oxygen gathering alloy of the vertical electrode 902, thereby creating oxygen vacancies in the metal oxide layer 610.

Figure 5:
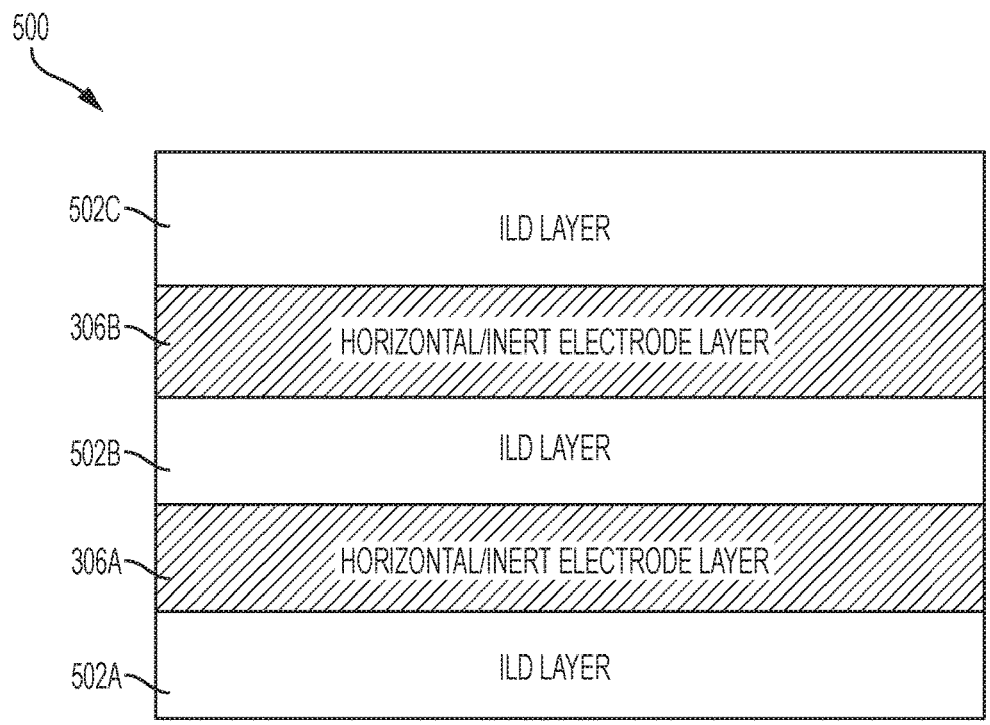

FIGS. 5-9 depict the results of various fabrication operations for forming the 3D vertical ReRAM array 300A shown in FIG. 4. FIG. 5 depicts a cross-sectional view of an initial array structure 500 after an initial set of fabrication having been used to form alternating layers of an ILD layer 502A, a horizontal/inert electrode layer 306A, an ILD Layer 502B, a horizontal/inert electrode layer 306B, and an ILD Layer 502C, configured and arranged as show. A variety of known fabrication operations are suitable for forming the initial array structure 500 so the details of such operations have been omitted in the interest of brevity.

Figure 6:
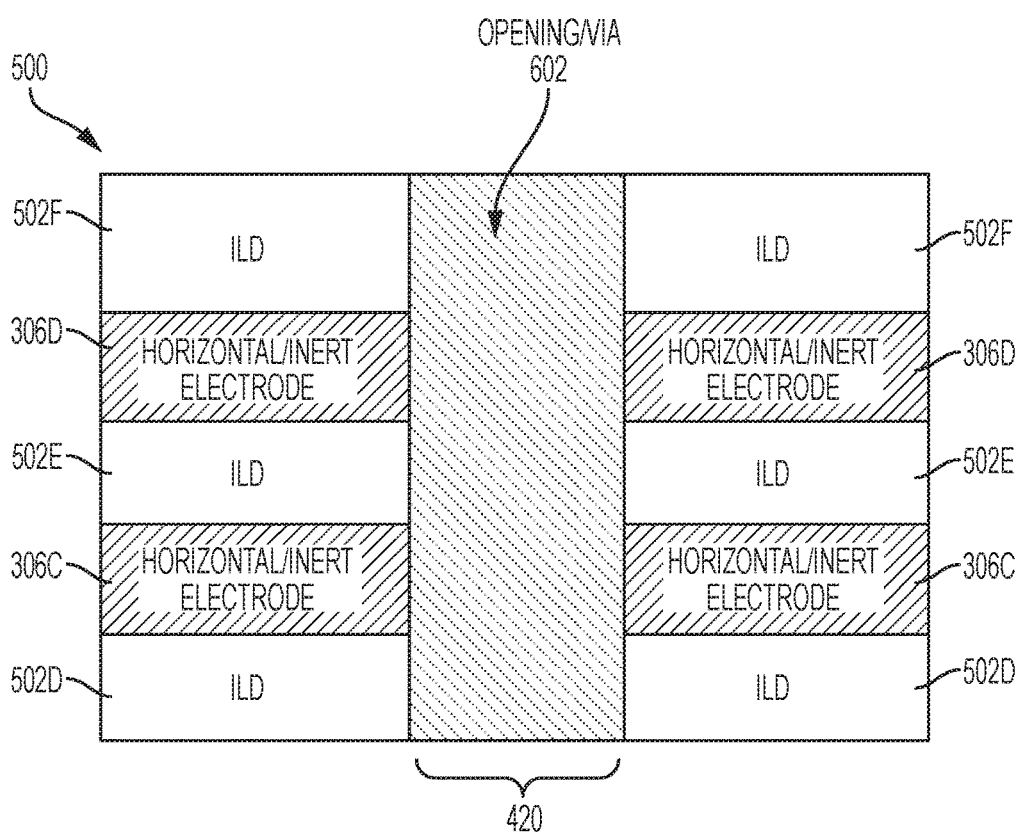

In FIG. 6, known fabrication operations (e.g., a reactive ion etch (RIE) has been used to form the opening/via 602 through the structure 500. The opening/via has width dimension 420. Forming the opening/via 602 results in the formation of ILD regions 502D, 502E, 502F and horizontal/inert electrode regions 306C, 306D.

Figure 7:
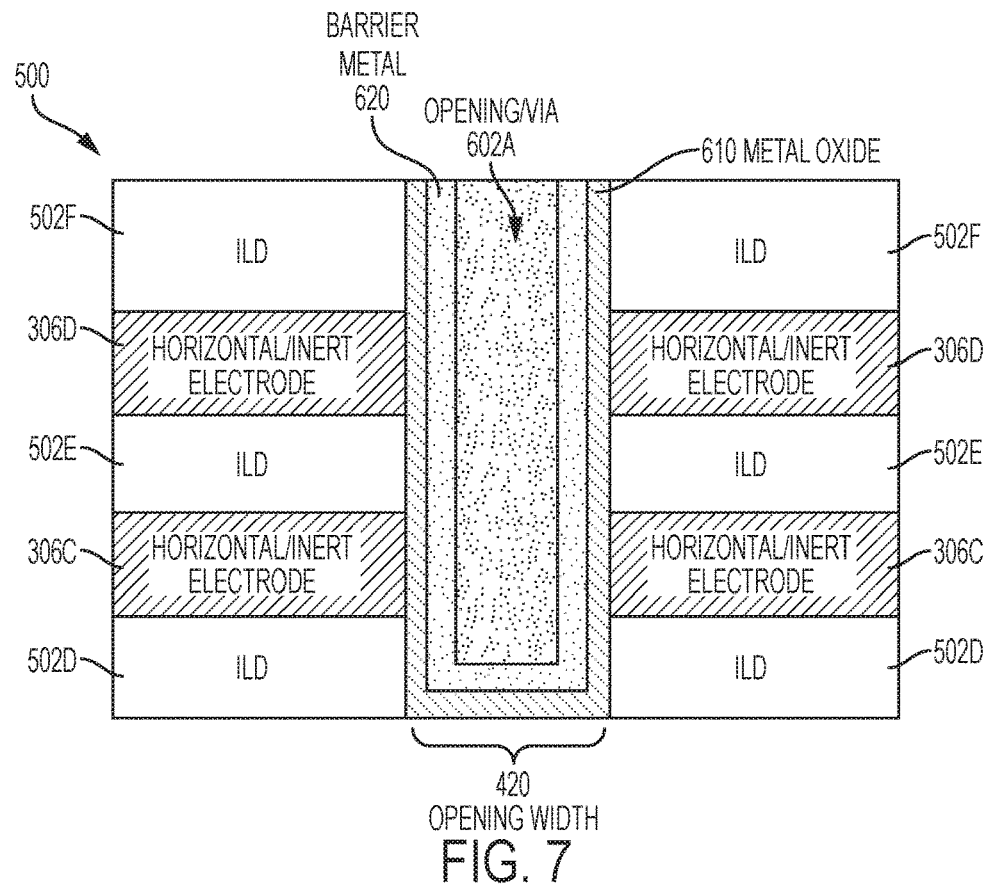

In FIG. 7, known fabrication operations (e.g., a conformal ALD) have been used to deposit a conformal metal oxide layer 610 such that the metal oxide layer 610 covers sidewalls of the opening/via 602 (shown in FIG. 6). Known fabrication operations (e.g., a conformal ALD) have also been used to deposit a conformal barrier metal layer 620 over the metal oxide layer 610. Depositing the metal oxide layer 610 and the barrier metal layer 620 results in forming an opening/via 602A.

In FIG. 8, known fabrication operations (e.g., a conformal ALD) have been used to deposit a conformal wetting layer 710 over the barrier metal layer 620. Depositing the wetting layer 710 over the barrier metal layer 620 results in forming an opening/via 602B.

In FIG. 9, known fabrication operations (e.g. sputtering, etc.) have been used to deposit a fill metal material 810 across the structure 500 and into the remaining volume of the opening/via 602B. A chemical mechanical planarization (CMP) is applied to planarize the fill metal material 810.

The deposition process of the fill metal materials 810 is performed at an elevated temperature (e.g. 400° C.) to facilitate reflow reactions between the wetting layer 710 and the fill metal 810, resulting in the vertical electrode 902 (shown in FIG. 4). The barrier metal layer 620 and the fill metal 810 are dissimilar metals. Accordingly, the wetting layer 710 assists in binding the barrier metal layer 620 to the alloy (vertical electrode 902) that results from mixing the wetting layer 710 and the fill metal 810 during the reflow process. The barrier layer material 620 is configured (or selected) to prevent diffusion and/or alloying of metal material between the metal oxide layer 610 and the wetting layer 710 and/or the fill metal 810 during the reflow process. The barrier layer material 620 is also configured (or selected) to allow oxygen molecules to diffuse through it to the post-reflow vertical electrode 902 to allow the post-reflow vertical electrode 902 to assist in the creation of oxygen vacancies in the metal oxide layer 610. The wetting layer 710 and the fill metal 810 intermix during the reflow process to form an alloy (e.g., Ti—Al or Co—Al) that functions in the final RSD storage cells 100B, 100C (shown in FIG. 4) the vertical electrode 902. In accordance with aspects of the invention, the reflowed alloy of the vertical electrode 902 has low resistivity properties. In accordance with aspects of the invention, the reflowed alloy of the vertical electrode 902 is also an oxygen getter material that contributes to the formation of oxygen vacancies in the metal oxide layer 610 by pulling or gathering oxygen from the metal oxide layer 610 and across the barrier metal layer 620. In embodiments of the invention, the diffusion of oxygen molecules across the barrier metal layer 620 can be tuned by selecting the material/alloy that forms the barrier metal layer 620 and by selecting the thickness of the barrier metal layer 620.

Figure 10:
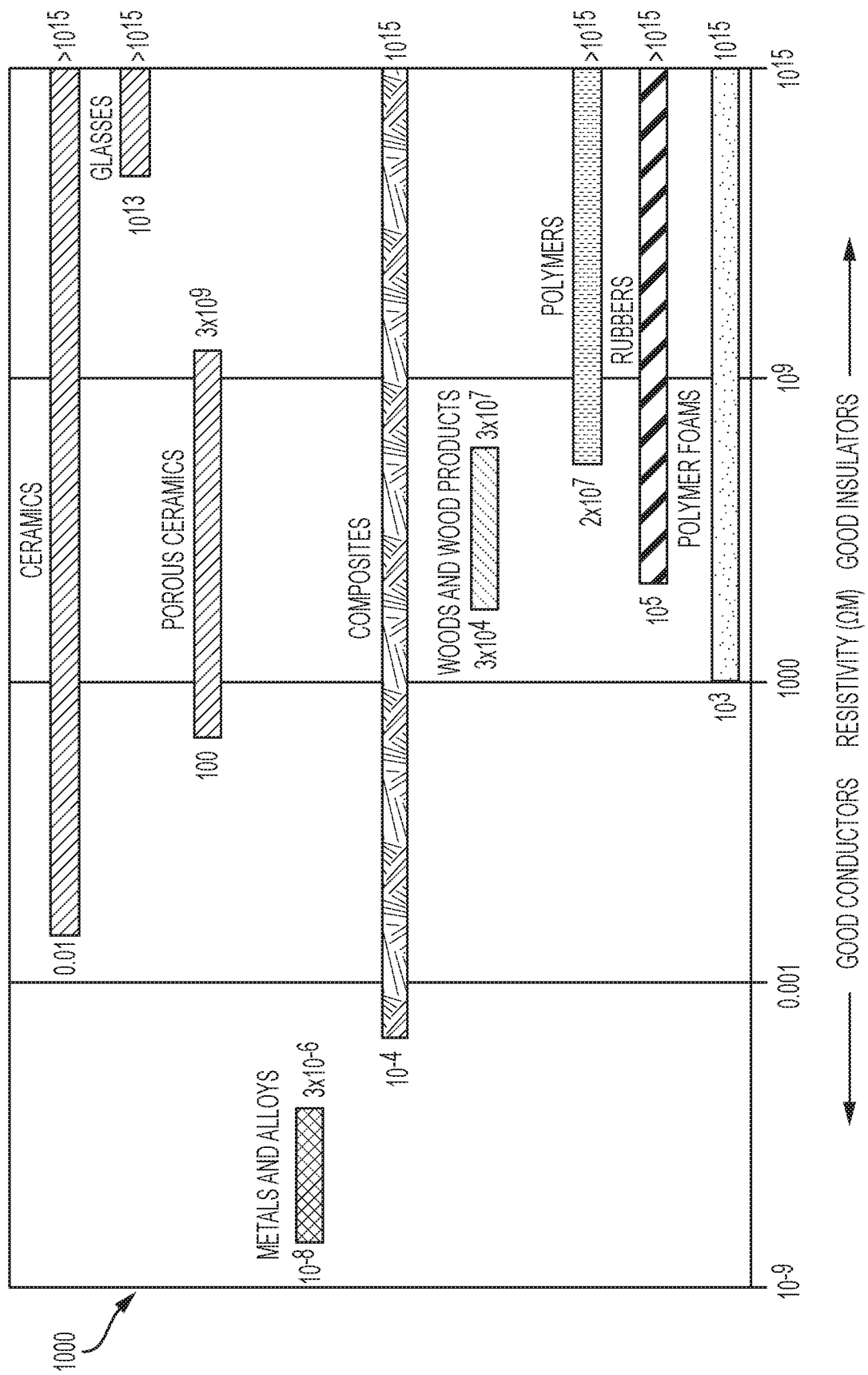
FIG. 10 depicts a diagram illustrating example resistivity values for various type of materials.

FIG. 10 depicts a diagram 1000 illustrating example resistivity values ("$\rho$") for various type of materials, and FIG. 11 depicts a table 1100 showing example ranges and material types for low resistivity, medium resistivity, and high resistivity according to aspects of the present invention. As shown in FIG. 10, the typical resistivity range for metals and alloys is between about $1 \times 10^{-8}$ ohm meters and about $3 \times 10^{-6}$ ohm meters. As shown in FIG. 11, a material can be considered to have low resistivity if its resistivity is below about $1 \times 10^6$ ohm meters.

The electrical resistivity of a particular conductor material is a measure of how strongly the material opposes the flow of electric current through it. This resistivity factor, sometimes called its "specific electrical resistance," enables the resistance of different types of conductors to be compared to one another at a specified temperature according to their physical properties without regards to their lengths or cross-sectional areas. Thus, the higher the resistivity value of $\rho$ the more resistance and vice versa. For example, the resistivity of a good conductor such as copper is on the order of $1.72 \times 10^{-8}$ ohm meters, whereas the resistivity of a poor conductor (insulator) such as air can be well over $1.5 \times 10^{14}$ ohm meters. Materials such as Cu and Al are known for their low levels of resistivity thus allowing electrical current to easily flow through them making these materials.

The vertical ReRAM array 300A (shown in FIG. 4) can be fabricated in the back end of line (BEOL) at relatively low temperatures, which allows for easy integration with CMOS devices and stacking in 3D. Accordingly, the vertical ReRAM array 300A can be used not only for NVM, but also for computing memories, thereby allowing fast data access to overcome the bottlenecks that can occur in conventional von Neumann computing architectures, as well as for computing architectures blurring the distinction between memory circuits and computing circuits, such as nonvolatile memristive logic computation or neuromorphic networks (e.g., ANNs).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a vertical resistive device, the method comprising:
   forming a conductive horizontal electrode;
   forming an opening that extends through the horizontal electrode;
   depositing a filament region within the opening such that the filament region is communicatively coupled to a sidewall of the horizontal electrode;
   depositing a barrier region within the opening such that the barrier region is communicatively coupled to the filament region; and
   forming a conductive vertical electrode within a remaining portion of the opening such that the vertical electrode is communicatively coupled to the barrier region;
   wherein:
   the vertical electrode comprises a first conductive alloy material comprising metals;
   oxygen vacancy formation in the filament region is controlled by the first conductive alloy material of the vertical electrode; and
   a room temperature resistivity of the first conductive alloy material is below about $5 \times 10^{-8}$ ohm meters and controlled by at least one of the metals that form the first conductive alloy material.

2. The method of claim 1, wherein the at least one of the metals that form the first conductive alloy material comprises aluminum.

3. The method of claim 2, wherein the first conductive alloy material comprises a titanium aluminum alloy or a cobalt aluminum alloy.

4. The method of claim 1, wherein forming the conductive vertical electrode further comprises depositing a wetting layer over the barrier region.

5. The method of claim 4, wherein forming the conductive vertical electrode further comprises depositing a fill metal over the wetting layer.

6. The method of claim 5, wherein forming the conductive vertical electrode further comprises reflowing the wetting layer and the fill metal to form an alloy of the wetting layer and the fill metal.

7. The method of claim 6, wherein the barrier region comprises a barrier material configured to prevent alloying of the filament region with the wetting layer and the fill metal.

8. The method of claim 7, wherein the barrier material is selected from a group consisting of titanium nitride (TiN), tantalum nitride (TaN), hafnium nitride (HfN), niobium nitride (NbN), tungsten nitride (WN), and combinations thereof.

9. A method of fabricating a vertical resistive device, the method comprising:
   forming a conductive horizontal electrode;
   forming an opening that extends through the horizontal electrode;

depositing a filament region within the opening such that the filament region is communicatively coupled to a sidewall of the horizontal electrode;

depositing a barrier region within the opening such that the barrier region is communicatively coupled to the filament region;

forming a conductive vertical electrode within a remaining portion of the opening such that the vertical electrode is communicatively coupled to the barrier region;

wherein:
the vertical electrode comprises a first conductive alloy material comprising metals;
oxygen vacancy formation in the filament region is controlled by the first conductive alloy material of the vertical electrode; and
a room temperature resistivity of the first conductive alloy material is below about $5\times10^{-8}$ ohm meters and controlled by at least one of the metals that form the first conductive alloy material; and forming a first dielectric layer across from the horizontal electrode.

10. The method of claim 9 further comprising forming a second dielectric layer on an opposite side of the horizontal electrode than the first dielectric layer.

11. The method of claim 10, wherein the opening also extends through the first dielectric layer and the second dielectric layer.

12. The method of claim 11, wherein sidewalls of the opening comprise sidewalls of the first dielectric layer and sidewalls of the second dielectric layer.

13. A method of fabricating a vertical resistive device, the method comprising:
forming a conductive horizontal electrode;
forming an opening that extends through the horizontal electrode;
depositing a filament region within the opening such that the filament region is communicatively coupled to a sidewall of the horizontal electrode;
depositing a barrier region within the opening such that the barrier region is communicatively coupled to the filament region; and
forming a conductive vertical electrode within a remaining portion of the opening such that the vertical electrode is communicatively coupled to the barrier region;
wherein:
the vertical electrode comprises a first conductive alloy material comprising metals;
oxygen vacancy formation in the filament region is controlled by the first conductive alloy material of the vertical electrode; and
a room temperature resistivity of the first conductive alloy material is below about $5\times10^{-8}$ ohm meters and controlled by at least one of the metals that form the first conductive alloy material; and
wherein the vertical resistive device functions as a resistive switching device (RSD).

14. The method of claim 13, wherein the conductive horizontal electrode functions as a bottom electrode of the RSD.

15. The method of claim 14, wherein the filament region functions as an insulator region of the RSD.

16. The method of claim 15, wherein the vertical electrode functions as a top electrode of the RSD.

17. The method of claim 13, wherein the horizontal electrode comprises titanium nitride (TiN) or tungsten (W).

18. The method of claim 13 further comprising:
forming a first dielectric layer across from the horizontal electrode; and
forming a second dielectric layer on an opposite side of the horizontal electrode than the first dielectric layer;
wherein:
the opening also extends through the first dielectric layer and the second dielectric layer; and
sidewalls of the opening comprise sidewalls of the first dielectric layer and sidewalls of the second dielectric layer.

19. The method of claim 13, wherein the filament region comprises a metal oxide comprising a compound selected from the group consisting of $HfO_2$, $Ta_2O_5$, and $ZrO_2$.

* * * * *